(12) United States Patent
Appenzeller et al.

(10) Patent No.: US 8,765,539 B2
(45) Date of Patent: Jul. 1, 2014

(54) SEMICONDUCTOR NANOSTRUCTURES, SEMICONDUCTOR DEVICES, AND METHODS OF MAKING SAME

(71) Applicant: International Business Machines Corporation, Armonk, NY (US)

(72) Inventors: Joerg Appenzeller, West Lafayette, IN (US); Supratik Guha, Chappaqua, NY (US); Emanuel Tutuc, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/155,972

(22) Filed: Jan. 15, 2014

(65) Prior Publication Data
US 2014/0127870 A1     May 8, 2014

Related U.S. Application Data

(62) Division of application No. 13/041,740, filed on Mar. 7, 2011, now Pat. No. 8,637,361, which is a division of application No. 11/622,358, filed on Jan. 11, 2007, now Pat. No. 7,948,050.

(51) Int. Cl.
*H01L 21/336* (2006.01)

(52) U.S. Cl.
USPC ............ 438/197; 438/585; 257/E21.409

(58) Field of Classification Search
CPC . H01L 29/6659; H01L 29/665; H01L 29/808; H01L 29/7833; H01L 21/32139
USPC ............ 438/197, 478, 585; 257/E21.409
See application file for complete search history.

(56) References Cited

U.S. PATENT DOCUMENTS

| 5,969,395 | A  | 10/1999 | Lee |
| 6,882,051 | B2 | 4/2005 | Majumdar et al. |
| 7,083,104 | B1 | 8/2006 | Empedocles et al. |
| 2003/0010987 | A1 | 1/2003 | Banin et al. |
| 2003/0089899 | A1 | 5/2003 | Lieber et al. |

(Continued)

FOREIGN PATENT DOCUMENTS

| JP | 2004532133 | 10/2004 |
| JP | 2006501690 | 1/2006 |
| JP | 2006295176 | 10/2006 |
| WO | 2006070670 | 7/2006 |

OTHER PUBLICATIONS

Australian Examination Report dated May 21, 2010 in connection with corresponding Singapore Patent application 200904278-9.

(Continued)

*Primary Examiner* — Jack Chen
(74) *Attorney, Agent, or Firm* — Scully, Scott, Murphy & Presser, P.C.; Vazken Alexanian (57) ABSTRACT

A semiconductor structure is provided, which includes multiple sections arranged along a longitudinal axis. Preferably, the semiconductor structure comprises a middle section and two terminal sections located at opposite ends of the middle section. A semiconductor core having a first dopant concentration preferably extends along the longitudinal axis through the middle section and the two terminal sections. A semiconductor shell having a second, higher dopant concentration preferably encircles a portion of the semiconductor core at the two terminal sections, but not at the middle section, of the semiconductor structure. It is particularly preferred that the semiconductor structure is a nanostructure having a cross-sectional dimension of not more than 100 nm.

19 Claims, 5 Drawing Sheets

(56) References Cited

U.S. PATENT DOCUMENTS

| | | |
|---|---|---|
| 2004/0213307 A1 | 10/2004 | Lieber et al. |
| 2005/0215731 A1 | 9/2005 | Furumi et al. |
| 2006/0053971 A1 | 3/2006 | Sun et al. |
| 2006/0210798 A1 | 9/2006 | Burda |
| 2006/0273328 A1 | 12/2006 | Niu et al. |
| 2007/0176824 A1* | 8/2007 | Stumbo et al. ............... 342/372 |

OTHER PUBLICATIONS

Greytak, A. B. et al. Growth and Transport Properties of Complementary Germanium Nanowire Field-Effect Transistors, Applied Physics Letters, May 24, 2004, pp. 4176-4178, vol. 84, No. 21.

Wang, D. et al., "Surface Chemistry and Electrical Properties of Germanium Nanowires", J. Am. Chem. Soc., 2004, pp. 11602-11611, vol. 126.

Lauhon, L. J., et al., "Epitaxial Core-Shell and Core-Multishell Nanowire Heterostructures", Nature Nov. 7, 2002, pp. 57-61, vol. 420.

Tutuc, E., et al., "Morphology of Germanium Nanowires Grown in Presence of B2H6", Applied Physics Letters, 2006, vol. 88.

Chung, J. et al., "Mapping of Electrostatic Potentials Within Core-Shell Nanowires by Electron Holography", Applied Physics Letters, 2006, vol. 88.

* cited by examiner

SEMICONDUCTOR NANOSTRUCTURES, SEMICONDUCTOR DEVICES, AND METHODS OF MAKING SAME

CROSS REFERENCE TO RELATED APPLICATIONS

This application is a divisional application of U.S. application Ser. No. 13/041,740, filed Mar. 7, 2011, which is a divisional application of U.S. application Ser. No. 11/622,358, filed Jan. 11, 2007, now U.S. Pat. No. 7,948,050. This application is also related to U.S. Ser. No. 14/156,006.

STATEMENT REGARDING FEDERALLY SPONSORED RESEARCH OR DEVELOPMENT

This invention was made with Government support under Contract No. 66001-05-C-8043 awarded by the Defense Advanced Research Project Agency (DARPA). The Government thus has certain rights to this invention.

FIELD OF THE INVENTION

The present invention generally relates to semiconductor nanostructures with a core-shell configuration that can be used for forming nano-sized semiconductor devices. More specifically, the present invention relates to field effect transistors (FETs) formed by such semiconductor nanostructures, as well as to methods for forming the FETs.

BACKGROUND OF THE INVENTION

Miniaturization of semiconductor devices, such as field effect transistors (FETs), has been the main driving force behind the incredible progress in the area of computation over the last half decade. Use of smaller FETs advantageously results in a higher packing density, as well as improved device performance. To further sustain this trend, novel nanostructures are explored as possible successors of the current state-of-art silicon devices. One type of nanostructure considered as particularly promising for forming nano-sized FETs is a semiconductor nanowire grown by homo-epitaxy (such as a germanium or silicon nanowire).

However, building devices from semiconductor nanowires requires reinventing the conventional complementary metal-oxide-semiconductor (CMOS) process flow and redesigning desired doping profiles and implementation details, so that such semiconductor nanowires may become the central portions of new high performance nano-sized FETs.

The conventional nano-sized FET contains a rather simple (i.e., non-ideal) semiconductor nanowire structure. Specifically, a top or bottom gate is used to control the electrostatics inside a channel region of the FET, which is located in the uniformly doped or undoped semiconductor nanowire, and source/drain metal contacts for the FET are attached to the two ends of the semiconductor nanowire. In such a FET configuration, the gate not only controls the electrostatics inside the channel region, but also impacts the injection properties at the metal/nanowire interface. This unavoidably results in a transmission probability that is substantially smaller than unity through this interface when an undoped nanowire is used, or in a very substantial shift of the threshold voltage when a uniformly doped nanowire is used for improving the contact quality.

The desired approach would involve a more complicated doping profile with a highly doped region located close to the metal contacts and a lowly doped or undoped region located close to the gate, but away from the contacts.

Currently, there are two standard approaches for realizing such a complicated doping profile in a nanowire—both suffering from substantial drawbacks. One approach is to grow the semiconductor nanowires in situ with a desired doping profile along the length of the nanowire. This approach, however, is incompatible with the requirement for precisely aligning the FET components, such as the gate and the source/drain metal contacts, at a later stage to this doping profile. Consequently, the parasitic capacitance contributions cannot be reduced as desirable, which ultimately limits improvement in the device performance. The second approach is to implant dopants into an existing semiconductor nanowire, using conventional dopant implantation techniques. It is highly desirable to use nanowires in a three-dimensional integrated approach, but the implanted dopant cannot form a uniform doping profile in various depths of the nanowire relative to the implantation direction. In addition, it is highly questionable whether it is possible to use an ion implantation approach for any nanostructure, since the ions would have to be "stopped" very precisely within the nanostructure.

There is therefore a continuing need for improved nanostructures with desired doping profiles that are suitable for forming FET devices.

SUMMARY OF THE INVENTION

The present invention provides a three-dimensional nanostructure with a doping profile characterized by uniform dopant concentrations along a longitudinal axis of the nanostructure and differential dopant concentrations in a radial direction thereof. Such a three-dimensional nanostructure is formed by using a combination of lithographical and deposition techniques, without the need for dopant implantation.

In one aspect, the present invention relates to semiconductor structure comprising multiple sections arranged along a longitudinal axis of the semiconductor structure, wherein a semiconductor core having a first dopant concentration extends along the longitudinal axis through the multiple sections of the semiconductor structure, and wherein a semiconductor shell having a second, higher dopant concentration encircles a portion of the semiconductor core at one or more, but not all, sections of the semiconductor structure.

Preferably, the semiconductor structure of the present invention has a middle section and two terminal sections located at opposite ends of the middle section. The semiconductor core extends through the middle section and two terminal sections of the semiconductor structure, and the semiconductor shell encircles a portion of the semiconductor core at the two terminal sections, but not at the middle section, of the semiconductor structure. More preferably, the semiconductor structure of the present invention is preferably a nanostructure with a cross-sectional dimension of not more than about 100 nm.

The semiconductor core and the semiconductor shell comprise any suitable semiconductor material. It is noted that in the present invention the semiconductor core and the semiconductor shell comprise the same semiconductor material.

In a specific embodiment of the present invention, the semiconductor core is undoped, while the semiconductor shell is doped with an n-type or a p-type dopant. Alternatively, both the semiconductor core and the semiconductor shell can be doped with an n-type dopant, provided that the first dopant concentration ranges from about $10^{11}$ to about $10^{17}$ atoms/$cm^3$, and the second, higher dopant concentration ranges from about $10^{17}$ to about $10^{21}$ atoms/$cm^3$. Further, both the semiconductor core and the semiconductor shell can be doped with a p-type dopant, provided that the first dopant concentration ranges from about $10^{11}$ to about $10^{17}$ atoms/cm$^3$, and the second, higher dopant concentration ranges from about $10^{17}$ to about $10^{21}$ atoms/cm$^3$.

In another aspect, the present invention relates to a method comprising:

forming a semiconductor structure having a longitudinal axis, wherein a semiconductor core having a first dopant concentration extends along the longitudinal axis, and wherein a semiconductor shell having a second, higher dopant concentration also extends along the longitudinal axis and encircles the semiconductor core; and selectively removing a portion of the semiconductor shell from at least one section of the semiconductor structure, so that a remaining portion of the semiconductor shell encircles a portion of the semiconductor core at other sections, but not the at least one section, of the semiconductor structure.

Preferably, the portion of the semiconductor shell is selectively removed by:

forming a patterned mask layer to selectively cover the other sections, but not said at least one section, of the semiconductor structure, wherein the portion of the semiconductor shell to be selectively removed is exposed at the at least one section of the semiconductor structure;

oxidizing the exposed portion of the semiconductor shell to form a semiconductor oxide at the at least one section of the semiconductor structure;

selectively etching the semiconductor oxide; and optionally, repeating the oxidizing and selective etching steps until the exposed portion of the semiconductor shell is completely removed to expose an underlying portion of the semiconductor core at the at least one section of the semiconductor structure.

In a specific embodiment of the present invention, the portion of the semiconductor shell is removed from a middle section of the semiconductor structure, so that the remaining portion of the semiconductor shell encircles a portion of the semiconductor core at two terminal sections at opposite ends of the middle section, but not at the middle section of the semiconductor structure.

In a further aspect, the present invention relates to a semiconductor device comprising:

a semiconductor structure comprising a middle section and two terminal sections located at opposite ends of the middle section along a longitudinal axis of said semiconductor structure, wherein a semiconductor core having a first dopant concentration extends along the longitudinal axis through the middle section and the two terminal sections of the semiconductor structure, and wherein a semiconductor shell having a second, higher dopant concentration encircles a portion of the semiconductor core at the two terminal sections, but not the middle section, of the semiconductor structure; and a field effect transistor (FET) comprising a source located at one of the two terminal sections of the semiconductor structure, a channel located at the middle section of the semiconductor structure, a drain located at the other of the two terminal sections of the semiconductor structure, and a gate structure over a portion of the semiconductor core at the middle section of the semiconductor structure.

The gate structure as mentioned hereinabove may comprise a gate dielectric layer and a gate conductor layer. The semiconductor device may further comprise metal contacts located over the source and drain of the FET, or metal silicide layers between the metal contacts and the source and drain of the FET.

In a still further aspect of the present invention, the present invention relates to a method for forming a semiconductor device comprising:

forming a semiconductor structure having a longitudinal axis, wherein a semiconductor core having a first dopant concentration extends along the longitudinal axis, and wherein a semiconductor shell having a second, higher dopant concentration also extends along the longitudinal axis and encircles the semiconductor core;

selectively removing a portion of the semiconductor shell from a middle section of the semiconductor structure, so that a remaining portion of the semiconductor shell encircles a portion of the semiconductor core at two terminal sections at opposite ends of the middle section, but not at the middle section of the semiconductor structure; and forming a field effect transistor (FET) from the semiconductor structure, wherein the FET comprises a source located at one of the two terminal sections of the semiconductor structure, a channel located at the middle section of the semiconductor structure, a drain located at the other of the two terminal sections of the semiconductor structure, and a gate structure over a portion of the semiconductor core at the middle section of the semiconductor structure.

Preferably, the FET as mentioned hereinabove is formed by:

forming a gate dielectric layer over the portion of the semiconductor core at the middle section of the semiconductor structure; and forming a gate conductor layer over the gate dielectric layer at the middle section of the semiconductor structure, wherein the portion of the semiconductor core at the middle section of the semiconductor structure, which is covered by the gate dielectric layer and gate conductor layer, forms the channel of the FET, wherein one of the two terminal sections located at one end of the middle section of the semiconductor structure forms the source of the FET, and wherein the other of the two terminal sections located at the other, opposite end of the middle section of the semiconductor structure forms the drain of the FET.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

The present invention provides an improved semiconductor structure, which is preferably an improved semiconductor nanostructure having a cross-sectional dimension of not more than about 100 nm.

Figure 1:
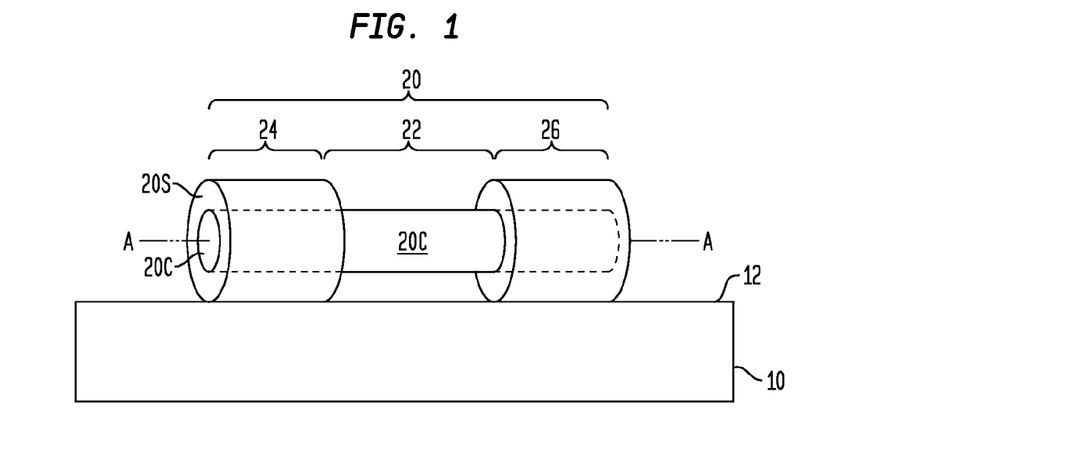
FIG. 1 shows a side view of a semiconductor nanostructure containing a differentially doped semiconductor core and shell, while a portion of the semiconductor shell is removed from a middle section of the semiconductor nanostructure to expose the underlying semiconductor core, according to one embodiment of the present invention.

FIG. 1 shows an exemplary semiconductor structure 20, according to one embodiment of the present invention. Specifically, the semiconductor structure 20 is located over an upper surface 12 of a substrate 10 and has a core-shell configuration including a semiconductor core 20C and a semiconductor shell 20S.

The substrate 10 may comprise any semiconductor or insulating materials. Preferably, the substrate 10 comprises a semiconductor material selected from the group consisting of. The substrate 10 may also comprise an organic semiconductor or a layered semiconductor such as Si/SiGe, a silicon-on-insulator (SOI) or a SiGe-on-insulator (SGOI). In some embodiments of the present invention, it is preferred that the substrate 10 be composed of a Si-containing semiconductor material, i.e., a semiconductor material that includes silicon. The substrate 10 may be doped or undoped, or it may contain both doped and undoped device regions therein. Further, the substrate 10 may comprise one or more isolation regions between adjacent device regions.

The semiconductor structure 20 is preferably a nanostructure having a cross-sectional dimension of not more than about 100 nm. The semiconductor core 20C and the semiconductor shell 20S of the semiconductor nanostructure 20 can be formed of any suitable semiconductor material, including, but not limited to: Si, SiC, SiGe, SiGeC, Ge alloys, GaAs, InAs, InP, as well as other III-V or II-VI compound semiconductors.

Preferably, the semiconductor core 20C and the semiconductor shell 20S comprise the same semiconductor material, but with different doping levels. For example, both 20C and 20S may comprise Si or SiGe, but the semiconductor 20C either is undoped or is doped with a dopant species (either an n-type or p-type dopant) at a first, relatively low doping concentration, while the semiconductor 20S is doped with the same (comment: if the doping profile n/p/n or p/n/p is chosen, the device may still prove useful but dopant fluctuation for ultimately scaled devices may prove harmful in the channel region) dopant species (either an n-type or p-type dopant) at a second, relatively high doping concentration.

In a preferred embodiment of the present invention, both the semiconductor core 20C and the semiconductor shell 20S are doped with an n-type dopant, such as phosphorus, arsenic, and antimony. More preferably, the semiconductor core 20C has a first, relatively low dopant concentration ranging from about $10^{11}$ to about $10^{17}$ atoms/cm$^3$, and the semiconductor shell 20S has a second, relatively high dopant concentration ranging from about $10^{17}$ to about $10^{21}$ atoms/cm$^3$.

In an alternative embodiment of the present invention, both the semiconductor core 20C and the semiconductor shell 20S are doped with a p-type dopant, such as aluminum, gallium, and indium. Preferably, the semiconductor core 20C has a first, relatively low dopant concentration ranging from about $10^{11}$ to about $10^{17}$ atoms/cm$^3$, and the semiconductor shell 20S has a second, relatively high dopant concentration ranging from about $10^{17}$ to about $10^{21}$ atoms/cm$^3$.

The semiconductor nanostructure 20 may comprise multiple sections arranged along a longitudinal axis A-A of the semiconductor structure 20. Preferably, but not necessarily, the semiconductor nanostructure 20 includes at least a middle section 22 and two terminal sections 24 and 26 at opposite ends of the middle section 22, as shown in FIG. 1. The semiconductor core 20C extends along the longitudinal axis A-A through all of the multiple sections 22, 24, and 26 of the structure 20. However, a portion of the semiconductor shell 20S is removed from the middle section 22 of the semiconductor nanostructure 20, so that the underlying semiconductor core 20C is exposed at the middle section 22. Correspondingly, the semiconductor shell 20S encircles only a portion of the semiconductor core 20C at the two terminal sections 24 and 26, but not the middle section 22, of the semiconductor nanostructure 20, as shown in FIG. 1.

It is important to note that although FIG. 1 illustratively shows a three-section semiconductor nanostructure 20 with a portion of the semiconductor shell 20S being removed from the middle section 22, the present invention is not so limited; instead, the present invention contemplates semiconductor structures with various numbers of sections ranging from two to a few hundred, while a portion of the semiconductor shell is removed from one or more, but not all, sections of the semiconductor structure.

Figure 3:
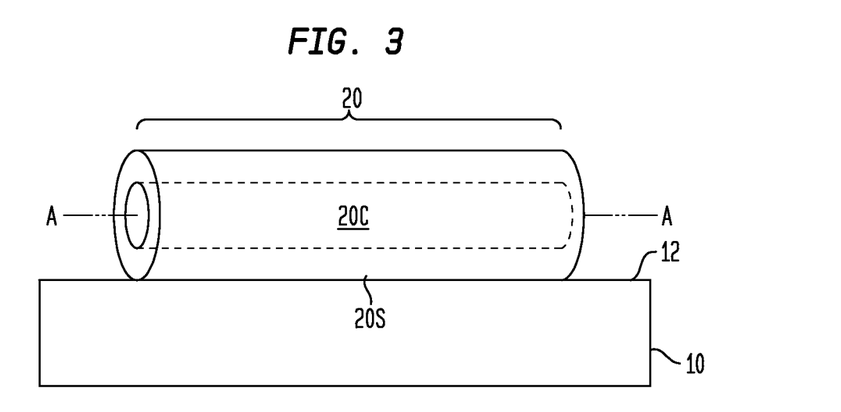
FIGS. 3-4 illustrate exemplary processing steps for forming the semiconductor nanostructure of FIG. 1, according to one embodiment of the present invention.
Figure 4:
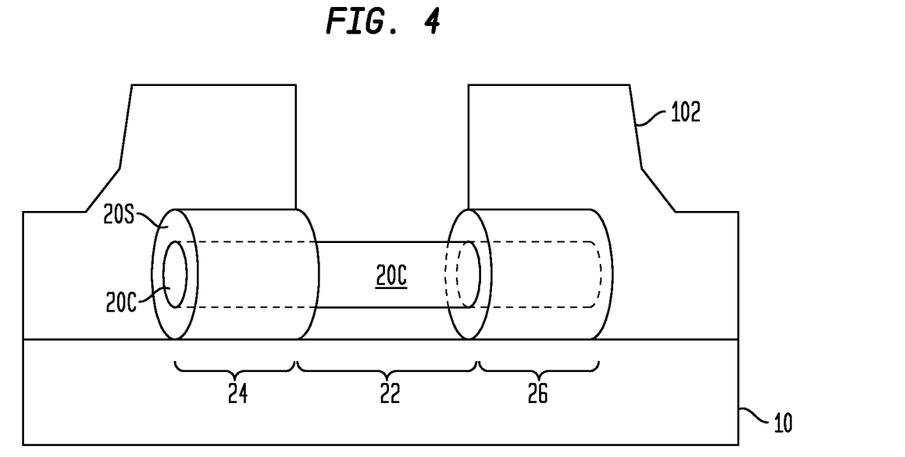

The semiconductor nanostructure 20 of FIG. 1 can be readily formed by conventional deposition and lithographic techniques, as illustrated in FIGS. 3-4.

First, a core-shell semiconductor nanostructure 20 with different doping levels in the semiconductor core 20C and the semiconductor shell 20S, as shown in FIG. 3, can be formed by an epitaxial growth process. The different doping levels in the semiconductor core 20C and the semiconductor shell 20S are formed by in situ adjustment of dopant concentration used during the epitaxial growth process.

A substrate, desirably but not necessarily Si, is plated (using thermal or e-beam deposition) with a thin (on the order of about 10 to about 30 Å) Au film. The substrate is then annealed at a temperature from about 400° C. to about 600° C. in order for the Au film to coalesce into small (on the order of about 20 to about 50 nm diameter) droplets. The substrate is subsequently exposed to an ambient of SiH$_4$ at a temperature from about 400° C. to about 550° C. and a SiH$_4$ pressure from about 1 mtorr to about 100 torr. This will result in one dimensional, Si nanowire growth with diameters from about 20 to about 50 nm and with a length directly proportional to the SiH$_4$ pressure and growth time. The growth rate will also depend on the temperature, with the growth rate increasing with the temperature. As an example, at a pressure of 0.15 torr and a temperature of 500° C., the growth rate is approximately 5 μm/hour. This procedure will result in undoped or lightly doped Si nanowires, which constitute the core of the inventive core-shell structures. The substrate as grown is subsequently exposed to an ambient of SiH$_4$ and B$_2$H$_6$ at a temperature ranging from about 550° C. to about 800° C. This will result in a conformal growth of B-doped Si that will wrap around the undoped Si nanowire core. The doping level of the conformal growth will be proportional to the relative concentration of B$_2$H$_6$ and SiH$_4$ in the growth ambient and the growth rate will depend on the SiH$_4$ pressure and the growth temperature. As an example, at a temperature of 550° C., a total pressure of 0.15 torr, using 50 sccm SiH$_4$ and 50 sccm B$_2$H$_6$ (20 ppm diluted in He), the conformal growth rate is 100 nm/hour, with a doping level of $5 \times 10^{19}$ cm$^{-3}$.

Next, a portion of the semiconductor shell 20S is selectively removed from a middle section 22 of the semiconductor nanostructure 20, thereby exposing the underlying semiconductor core 20C at the middle section 22, as shown in FIG. 4. Specifically, a patterned dielectric hard mask layer 102 is formed, which covers only the two terminal sections 24 and 26 of the semiconductor nanostructure 20, while the middle section 22 is exposed. The patterned dielectric hard mask layer 102 may contain any suitable dielectric mask materials, such as silicon oxides, silicon nitrides, silicon oxynitrides, etc. Preferably, the patterned dielectric hard mask layer 102 comprises a patterned silicon nitride mask formed by conventional lithography and etching techniques. A selective oxidization step is then carried out to oxidize an exposed portion of the semiconductor shell 20S at the middle section 22, followed by a selective etching step that selectively etches the semiconductor oxide so formed over the un-oxidized semiconductor. When the exposed portion of the semiconductor shell 20S comprises silicon, which forms silicon oxide after the oxidation step, a HF-based etching solution can be used to remove the oxidized semiconductor shell 20S.

The selective oxidation and etching steps can be repeated until the semiconductor shell 20S has been entirely removed from the middle section 22 of the semiconductor nanostructure 20 to expose the underlying semiconductor core 20C, as shown in FIG. 4.

Figure 2:
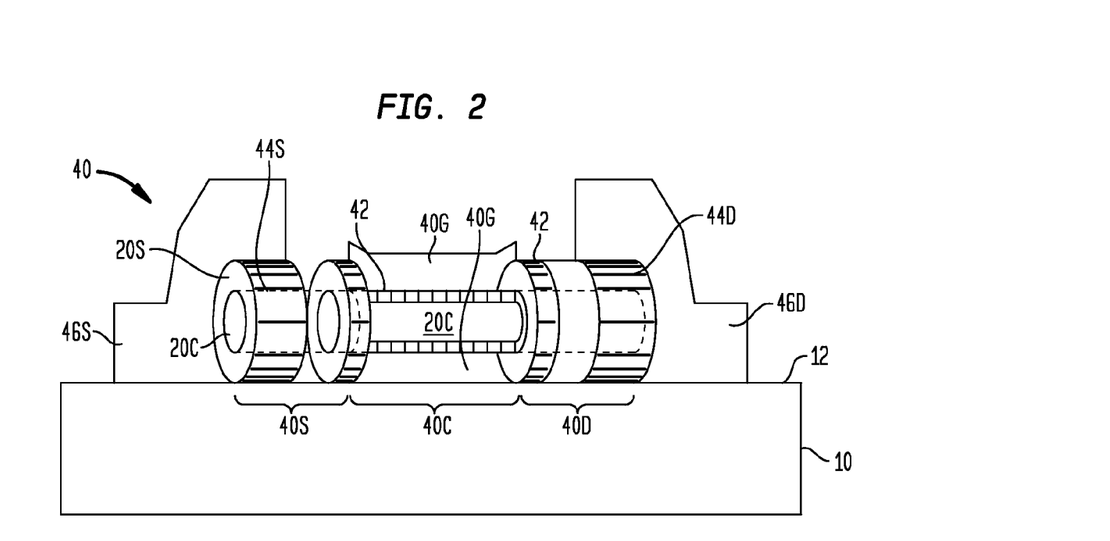
FIG. 2 shows a side view of a field effect transistor (FET) formed using the semiconductor nanostructure of FIG. 1, while the FET contains a channel region located at the middle section of the semiconductor nanostructure and source/drain regions located at two terminal sections of the semiconductor nanostructure, according to one embodiment of the present invention.

The semiconductor nanostructure 20 as illustrated by FIG. 4 of the present invention can be readily used to form a nano-sized semiconductor device, such as a nano-sized field effect transistor (FET) 40, as shown in FIG. 2.

Specifically, the nano-sized FET 40 comprises a source 40S located at one terminal section 24 of the semiconductor nanostructure 24, a channel 40C located at the middle section 22, and a drain located at the other semiconductor section 26. The channel 40C of the FET 40 includes the exposed portion of the semiconductor core 20C at the middle section 22 of the nanostructure 20. A gate structure of the FET 40, which comprises a gate dielectric layer 42 and a gate conductor layer 40G, is formed over the channel 40C, i.e., the exposed portion of the semiconductor core 20C at the middle section 22, as shown in FIG. 4. Source and drain metal contacts 46S and 46D may be provided to allow access to the FET 40. Further, metal silicide layers 44S and 44D can be formed between the metal contacts 46S and 46D and the source and drain 40S and 40D of the FET 40, so as to reduce the contact resistance of the FET 40.

The FET 40 as shown in FIG. 2 can be readily integrated into CMOS circuits by using a fabrication process that is compatible with conventional CMOS processing steps. FIGS. 5-9 shows specific exemplary processing steps for forming the FET 40, according to one embodiment of the present invention.

Figure 5:
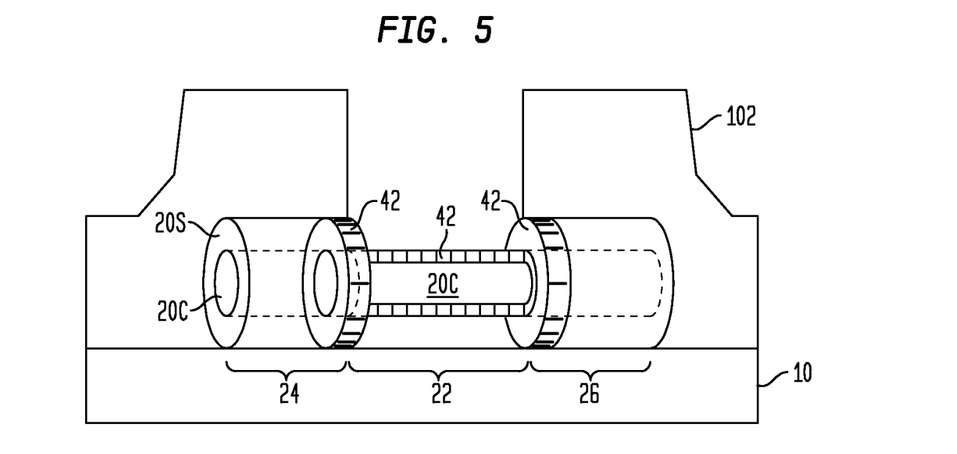
FIGS. 5-9 illustrate exemplary processing steps for forming the FET of FIG. 2 by using the semiconductor nanostructure of FIG. 1, according to one embodiment of the present invention.

First, the semiconductor nanostructure 20 as shown in FIG. 4 is subject to a thermal oxidation or nitrification process, which forms an oxide or nitride layer 42 over the exposed surfaces of the semiconductor nanostructure 20 (i.e., surfaces not covered by the patterned dielectric hard mask layer 102), as shown in FIG. 5. Such oxide or nitride layer 42 can function as the gate dielectric layer for the FET to be formed.

Figure 6:
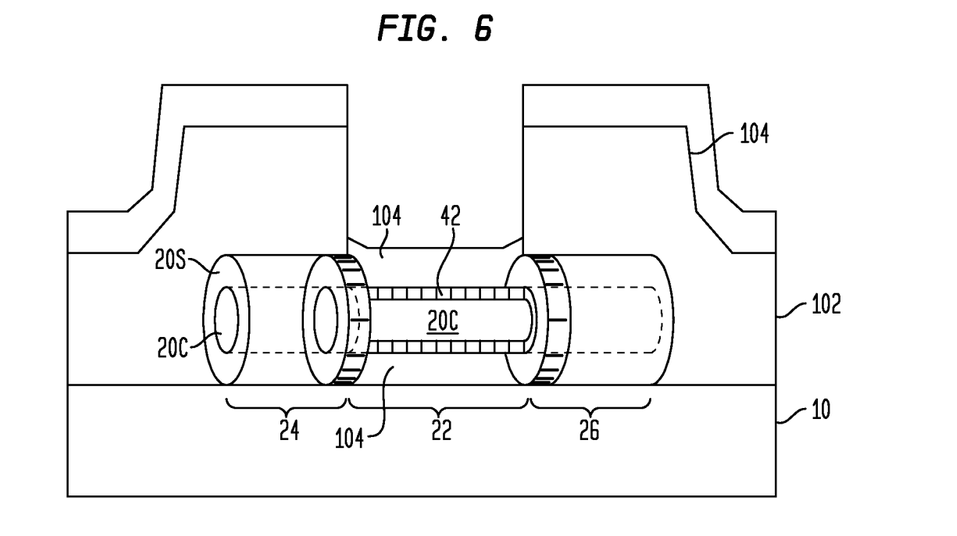
Figure 7:
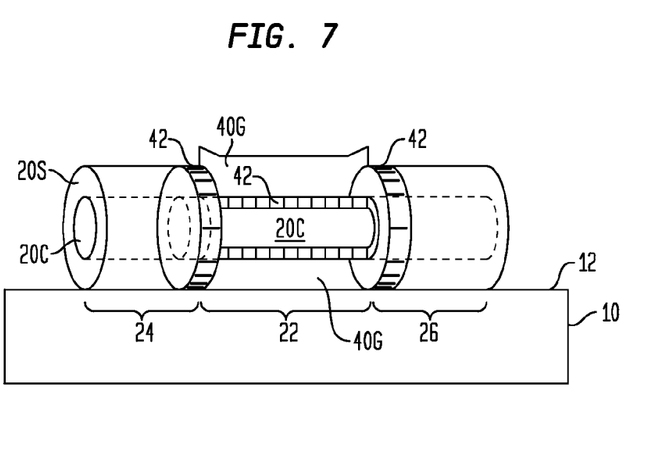

Next, a gate conductor material 104 is deposited over the entire structure, as shown in FIG. 6. The gate conductor material 104 may comprise polysilicon, metal, metal alloy, metal silicide, metal nitride, or any other conductive material suitable for forming a FET gate conductor. The gate conductor material 104 and the patterned hard mask layer 102 are subsequently removed from the two terminal sections 24 and 26 of the semiconductor nanostructure 20, as shown in FIG. 7. The remaining gate conductor material 104 at the middle section 22 of the semiconductor nanostructure 20 thereby forms a gate conductor layer 40G that overlays the gate dielectric layer 42 and the semiconductor core 20C, which will function as the channel for the FET to be formed.

Figure 8:
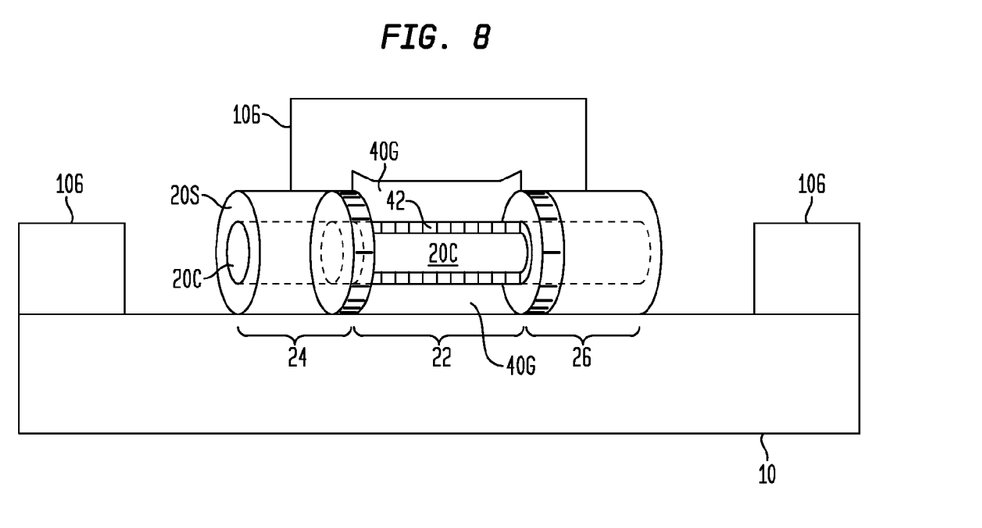

A patterned photoresist layer 106 is then formed over the structure of FIG. 7 by conventional lithographic techniques. The patterned photoresist layer 106 selectively protects the middle section 22 of the semiconductor nanostructure 20, while the two terminal sections 24 and 26 of the semiconductor nanostructure 20 are exposed, as shown in FIG. 8. The patterned photoresist layer 106 defines the source/drain regions of the FET to be formed, which are located in the two terminal sections 24 and 26 of the semiconductor nanostructure 20. Alignment of this patterned layer relative to the gate 40G is not critical, as long as it does not overlap with the region 22.

Figure 9:
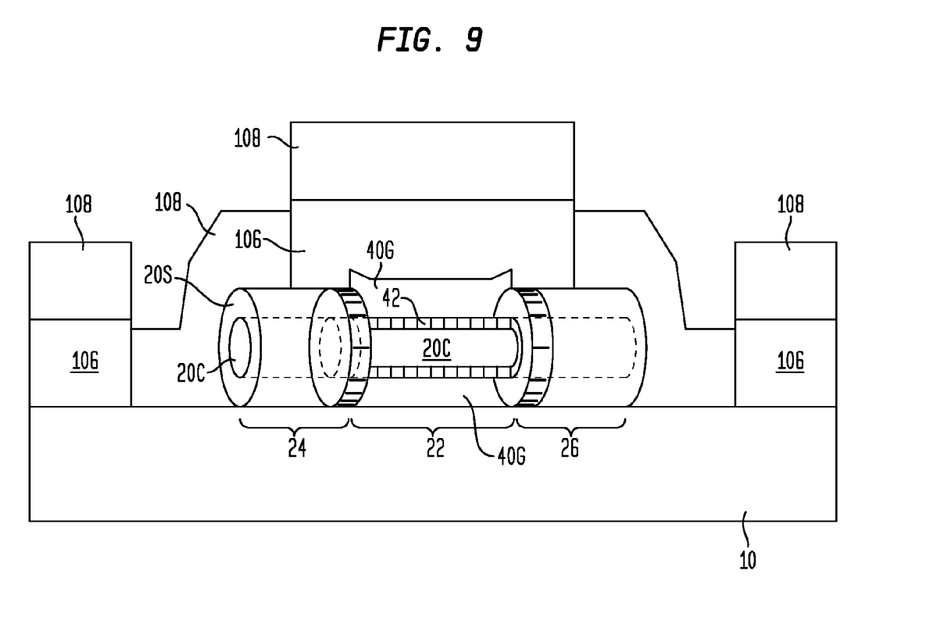

Subsequently, a metal layer 108 is deposited over the entire structure, as shown in FIG. 9. Portions of the metal layer 108 deposited over the exposed terminal sections 24 and 26 of the semiconductor nanostructure 20 forms source/drain metal contacts or electrodes 46S and 46D as shown in FIG. 2, while remaining portions of the metal layer 108 can be removed together with the patterned photoresist layer by resist stripping. A further annealing step can optionally be carried out to form the metal silicide layers 44S and 44D, as shown in FIG. 2.

The FET 40 as shown in FIG. 2 exhibits improved injection properties between the metal contacts 46S and 46D, the metal silicide layers 44S and 44D, the highly doped semiconductor shell 20S, and the undoped or lowly doped semiconductor core 20C, which conjunctively function to improve the overall device performance of the FET 40. On one hand, carrier injection occurs from the metal contacts 46S and 46D through the metal silicide layers 44S and 44D into the highly doped semiconductor shell 20S at the source and drain regions 40S and 40D for a relatively low contact resistance. The relatively high doping level in the semiconductor shell 20S ensures such a low contact resistance. On the other hand, when the carriers (either electrons or holes) reach the channel region 40C, they are injected from the semiconductor shell 20S into the semiconductor core 20C at the channel region 40C. Since the junction between the semiconductor shell 20S and the semiconductor core 20C is a semiconductor-to-semiconductor junction, ideal carrier injection can be ensured.

Further, because the gate conductor 40G only covers the semiconductor core 20C at the channel region 40C, no undesirable gate-voltage-dependent Schottky barriers are formed to impact the device performance.

More importantly, the gate dielectric layer 42 and the gate conductor layer 40G are formed in a self-aligned manner with respect to the channel region 40C of the FET 40, thereby ensuring minimum parasitic capacitance contributions.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for forming a semiconductor device, comprising:
    forming a semiconductor structure having a longitudinal axis, wherein a semiconductor core having a first dopant concentration extends along the longitudinal axis, and wherein a semiconductor shell having a second, higher dopant concentration also extends along the longitudinal axis and encircles the semiconductor core;
    selectively removing a portion of the semiconductor shell from a middle section of the semiconductor structure, so that a remaining portion of the semiconductor shell encircles a portion of the semiconductor core at two terminal sections at opposite ends of the middle section, but not at the middle section of the semiconductor structure; and
    forming a field effect transistor (FET) from the semiconductor structure, wherein the FET comprises a source located at one of the two terminal sections of the semiconductor structure, a channel located at the middle section of the semiconductor structure, a drain located at the other of the two terminal sections of the semiconductor structure, and a gate structure over a portion of the semiconductor core at the middle section of the semiconductor structure.

2. The method of claim 1, wherein the portion of the semiconductor shell is selectively removed by:
    forming a patterned mask layer to selectively cover the two terminal sections, but not said middle section, of the semiconductor structure, wherein the portion of the semiconductor shell to be selectively removed is exposed at said middle section of the semiconductor structure;
    oxidizing the exposed portion of the semiconductor shell to form a semiconductor oxide at said middle section of the semiconductor structure; and
    selectively etching the semiconductor oxide.

3. The method of claim 2 further comprising repeating the oxidizing and selective etching steps until the exposed portion of the semiconductor shell is completely removed to expose an underlying portion of the semiconductor core at said middle section of the semiconductor structure.

4. The method of claim 1, wherein the portion of the semiconductor shell is removed from a middle section of the semiconductor structure, so that the remaining portion of the semiconductor shell encircles a portion of the semiconductor core at two terminal sections at opposite ends of the middle section, but not at the middle section of the semiconductor structure.

5. The method of claim 1, wherein the semiconductor structure is a nanostructure having a cross-sectional dimension of not more than about 100 nm.

6. The method of claim 1, wherein both the semiconductor core and the semiconductor shell comprise the same semiconductor material.

7. The method of claim 1, wherein said semiconductor core and said semiconductor shell comprises Si, SiC, SiGe, SiGeC, Ge alloys, III-V or II-VI compound semiconductors.

8. The method of claim 6, wherein the semiconductor core is undoped and the semiconductor shell is doped.

9. The method of claim 8, wherein the semiconductor shell is doped with an n-type dopant.

10. The method of claim 8, wherein t wherein the semiconductor shell is doped with a p-type dopant.

11. The method of claim 6, wherein both the semiconductor core and the semiconductor shell are doped with an n-type dopant, wherein the first dopant concentration ranges from about $10^{11}$ to about $10^{17}$ atoms/cm$^3$, and wherein the second, higher dopant concentration ranges from about $10^{17}$ to about $10^{21}$ atoms/cm$^3$.

12. The method of claim 6, wherein both the semiconductor core and the semiconductor shell are doped with a p-type dopant, wherein the first dopant concentration ranges from about $10^{11}$ to about $10^{17}$ atoms/cm$^3$, and wherein the second, higher dopant concentration ranges from about $10^{17}$ to about $10^{21}$ atoms/cm$^3$.

13. The method of claim 2, wherein said selectively etching comprises etching in HF.

14. The method of claim 1, wherein said forming said semiconductor structure comprises epitaxial growth process.

15. The method of claim 14, wherein different doping levels in the semiconductor core and the semiconductor shell are formed by in situ adjustment of dopant concentration used during said epitaxial growth process.

16. The method of claim 1, wherein the gate structure comprises a gate dielectric layer and a gate conductor layer.

17. The method of claim 11, wherein the FET is formed by:
    forming a gate dielectric layer over the portion of the semiconductor core at the middle section of the semiconductor structure; and
    forming a gate conductor layer over the gate dielectric layer at the middle section of the semiconductor structure, wherein the portion of the semiconductor core at the middle section of the semiconductor structure, which is covered by the gate dielectric layer and gate conductor layer, forms the channel of the FET, wherein one of the two terminal sections located at one end of the middle section of the semiconductor structure forms the source of the FET, and wherein the other of the two terminal sections located at the other, opposite end of the middle section of the semiconductor structure forms the drain of the FET.

18. The method of claim 17, further comprising forming metal contacts over the source and drain of the FET.

19. The method of claim 17, further comprising one or more annealing steps to form metal silicide layers between the metal contacts and the source and drain of the FET.

\* \* \* \* \*